United States Patent
Oh et al.

(10) Patent No.: US 7,245,543 B2
(45) Date of Patent: *Jul. 17, 2007

(54) DATA READ CIRCUIT FOR USE IN A SEMICONDUCTOR MEMORY AND A METHOD THEREFOR

(75) Inventors: Hyung-Rok Oh, Sungnami-si (KR); Woo-Yeong Cho, Yongin-si (KR); Choong-Keun Kwak, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/249,858

(22) Filed: Oct. 13, 2005

(65) Prior Publication Data

US 2006/0034112 A1    Feb. 16, 2006

Related U.S. Application Data

(63) Continuation of application No. 10/943,300, filed on Sep. 17, 2004, now Pat. No. 6,982,913.

(30) Foreign Application Priority Data

Sep. 19, 2003  (KR) ............................... 2003-65023

(51) Int. Cl.
    *G11C 7/00* (2006.01)
(52) U.S. Cl. ...................... 365/203; 365/205; 365/196; 365/189.11
(58) Field of Classification Search ................ 365/203, 365/205, 196, 189.11
    See application file for complete search history.

(56) References Cited

U.S. PATENT DOCUMENTS

| 6,343,039 | B2 * | 1/2002 | Agawa et al. | 365/203 |
| 6,396,305 | B1 * | 5/2002 | Carlson | 326/98 |
| 6,426,671 | B1 * | 7/2002 | Kono | 327/541 |
| 6,801,463 | B2 * | 10/2004 | Khellah et al. | 365/203 |
| 6,982,913 | B2 * | 1/2006 | Oh et al. | 365/203 |

\* cited by examiner

*Primary Examiner*—Connie C. Yoha
(74) *Attorney, Agent, or Firm*—F. Chau & Associates, LLC

(57) ABSTRACT

A data read circuit and method for use in a semiconductor memory device that has a memory cell array are provided. The circuit includes a selector for selecting a unit cell within the memory cell array in response to an address signal; a clamping unit for supplying a clamp voltage having a level for a read operation to a bit line of the selected unit cell in response to a clamp control signal; a precharge unit for precharging a sensing node to a voltage having a power source level in response to a control signal of a first state in a precharge mode, and compensating through the sensing node for a reduced quantity of current at the bit line in response to a control signal of a second state in a data sensing mode; and a sense amplifier unit for comparing a level of the sensing node with a reference level, and for sensing data stored in the selected unit cell.

11 Claims, 10 Drawing Sheets

US 7,245,543 B2

DATA READ CIRCUIT FOR USE IN A SEMICONDUCTOR MEMORY AND A METHOD THEREFOR

CROSS-REFERENCE TO RELATED APPLICATION

This application is a continuation of application Ser. No. 10/943,300, now Pat. No. 6,982,913 filed Sep. 17, 2004, which claims priority to Korean Patent Application No. 2003-0065023, filed Sep. 19, 2003, the disclosure of which in its entirety is incorporated by reference herein.

TECHNICAL FIELD

The present invention relates to a semiconductor memory device, and more particularly, to a data read circuit, which includes a bias current supplier to compensate for current flowing into a unit cell and a method therefor.

DISCUSSION OF THE RELATED ART

The need for high performance semiconductor memories having low power consumption has led to the development of a Phase Change Random Access Memory (PRAM). The PRAM is a nonvolatile memory device for storing data by using a material such as $Ge_xSb_yTe_z$ (GST) for which a phase is changed when a change in temperature changes its resistance.

Referring to FIG. 1, a unit cell of a PRAM is illustrated. The unit cell of the PRAM is constructed of a transistor M1 and a variable resistor. The variable resistor includes an upper electrode 12, a phase change layer 14 that is positioned between a lower part of the upper electrode 12 and an upper part of a lower electrode contact 16, which is connected to a lower electrode 10 at a lower part, and the lower electrode 10. The phase change layer 14 is made of GST whose resistance changes in conformity with a change in temperature.

The PRAM has a characteristic in that a phase of the phase change layer 14 is changed to an amorphous state or crystalline state in conformity with a change in temperature. A resistance value of the PRAM in the amorphous state has a high resistance state and the resistance value of the PRAM in the crystalline state has a low resistance state. Thus, if one defines 'RESET' as a case when the phase change layer 14 is changed from the crystalline state to the amorphous state, one can then define 'SET' for a case when the phase change layer 14 is changed from the amorphous state to the crystalline state.

In order to change the temperature of the phase change layer 14, a laser beam or joule heating, which is generated by applying current to a heater, may be used. In the joule heating method, the temperature of the heater and heating time vary with respect to a quantity of current applied to the heater and the amount of time the current is applied, to change the phase change layer 14 to the crystalline or amorphous states. Thus, the phase change layer 14 becomes a part of a memory device that is capable of storing information.

FIG. 2 illustrates a circuit diagram of a unit cell of a PRAM. With reference to FIG. 2, a gate of a negative channel metal oxide semiconductor (NMOS) access transistor M1 is connected to a word line WL, and an upper electrode of a variable resistor C is connected to a bit line BL. A lower electrode of the variable resistor C is coupled with a drain of the access transistor M1. A source of the access transistor M1 is grounded. In addition, the upper electrode of the variable resistor C may be coupled with a source of the access transistor M1 and the lower electrode of the variable resistor C may be grounded.

FIG. 3 is a graph illustrating a change of the phase change layer based on time and temperature and will be used to describe a read and write operation in a PRAM. The write operation in the PRAM will be described as follows.

As shown in graph 1 of FIG. 3, a phase change layer is heated over a melting temperature Tm and then is rapidly cooled by a time t1, hence the phase change layer is changed to the amorphous state to have a high resistance state. This state is defined as a 'RESET' state or data "1". As shown in graph 2, the phase change layer is heated at a temperature that is lower than the melting temperature Tm and higher than a crystallization temperature Tx. Then the phase change layer is changed to the crystalline state to have a low resistance state. This state is defined as a 'SET' state or data "0".

The read operation will be described as follows. In the read operation, a bit line and a word line are enabled, and a memory cell is selected. Then an external current is applied to generate a cell-through current dependent upon a resistance of the phase change layer. The read operation discriminates between data "1" and data "0" by driving a current sense amplifier and a voltage sense amplifier, the current sense amplifier for sensing a change of current passing through a bit line of the selected cell in comparison with a reference current, and the voltage sense amplifier for sensing a change of voltage of the bit line in comparison with a reference voltage.

FIG. 4 is a graph illustrating a characteristic of current versus voltage for a phase change layer in a PRAM unit cell. As shown in FIG. 4, a graph SET indicates a resistance value of the phase change layer based on a current and voltage under a 'SET' state, and a graph RESET indicates a resistance value of the phase change layer based on a current and voltage under a 'RESET' state. In FIG. 4, a read region A is formed only within a threshold voltage (Vth) region of the phase change layer, namely, a region where a resistance difference between the 'SET' state and the 'RESET' state is great. The threshold voltage of the phase change layer is about 1.2v. Because a bit line level is higher than a level of the read region A, the read operation is performed by clamping the bit line level at a level determined to be appropriate for the read operation.

FIG. 5 is a circuit diagram of a prior art data read circuit. FIG. 6 is a timing diagram illustrating an operation of the data read circuit shown in FIG. 5. The operation of FIG. 5 will be described referring to FIG. 6 as follows.

With reference to FIG. 5, the data read circuit includes a precharge positive channel metal oxide semiconductor (PMOS) transistor MP1 in which a gate receives a precharge control signal VPRE, a source is connected to a power source, and a drain is connected to an input terminal of a sense amplifier VSA and a drain of a clamping NMOS transistor MN1. The data read circuit also includes the clamping transistor MN1 in which the drain is coupled with the drain of the precharge transistor MP1 and the input terminal of the sense amplifier VSA, a source is coupled with a drain of a selector NMOS transistor MN2, and a gate receives a clamp control signal VCMP. The data read circuit also includes the selector transistor MN2 in which a drain is connected to the source of the clamping transistor MN1, a source is connected to a bit line BL of a unit cell, and a gate receives a selector signal VY; and a unit cell whose bit line BL is connected to the source of the selector transistor MN2 and whose access transistor gate receives a word line address signal VWL.

In order to read data in the unit cell within a memory cell array, the data read circuit operates as follows. As shown in FIG. 6, the precharge transistor MP1 is turned on to precharge a sensing node VDL as a power source VCC before a read command signal READ is applied. When the unit cell is selected by an address signal VWL, the selector signal VY and the READ command signal are applied, and a precharge control signal VPRE is transited from low to high. When the precharge control signal VPRE is transited from low to high, the precharge transistor MP1 is turned off. Thus, the operation of precharging the sensing node VDL as the power source VCC through the precharge transistor MP1 is stopped. At the same time, a clamp control signal VCMP having a determined direct current level is applied to the gate of the clamping transistor MN1. A level of the bit line BL is clamped at a level by the clamp control signal VCMP at a level determined to be appropriate for the read operation, without deviating from the threshold voltage Vth of the phase change layer. Whereby, the supplied current flows through the phase change layer provided within the unit cell. That is, a through-current ICELL dependent upon the phase change layer flows through the phase change layer. The through-current ICELL flows with different current quantities in conformity with a state of the unit cell, namely, the previously mentioned 'SET' or 'RESET' states.

If the phase change layer within the unit cell is under the 'RESET' state, the unit cell has a high resistance value, with a small quantity of the through-current ICELL flowing from the bit line BL having a determined level. If the unit cell is under the 'SET' state, the unit cell has a low resistance value, generating a large quantity of the through-current ICELL. Thus, the sensing node VDL as an input terminal of the sense amplifier VSA also has a different level. The sense amplifier VSA checks and decides whether a state of the unit cell is high or low, by comparing a level of the input terminal VDL with a reference voltage VREF. If a voltage of the sensing node VDL as the input terminal of the sense amplifier VSA is higher than the reference voltage VREF, the voltage is determined to be 'high' and then is outputted. If the voltage of the sensing node VDL is lower than the reference voltage VREF, the voltage is determined to be 'low' and then is outputted.

In the prior art data read circuit of FIG. 5, the precharge transistor MP1 is turned off after the sensing node is precharged as a power source, and when a data read operation starts, a charge of the sensing node VDL is consumed as the through-current ICELL of the unit cell by the read operation. Thus, when the state of the unit cell is under the 'SET' state, namely, a low resistance state, the voltage of the sensing node VDL is preserved; however, when the state of the unit cell is under the 'RESET' sate, namely, a high resistance state, the voltage of the sensing node VDL is not preserved as a level of the power source VCC, and is reduced as shown in FIG. 6, causing the possibility of an error which could be detrimental to a high speed operation in a semiconductor memory device.

SUMMARY OF THE INVENTION

An exemplary embodiment of the present invention provides a data read circuit for use in a semiconductor memory device which has a memory cell array having a plurality of unit cells each of which is composed of one access transistor and one variable resistor, the data read circuit including a selector for selecting a unit cell provided within the memory cell array in response to an address signal; a clamping unit connected between a bit line coupled with the selected unit cell and a sensing node, the clamping unit for supplying a clamp voltage having a level for a read operation to the bit line of the selected unit cell in response to a clamp control signal; a precharge unit for precharging the sensing node to a voltage having a power source level in response to a control signal of a first state applied during a precharge mode, and compensating through the sensing node for a reduced quantity of current at the bit line connected to the selected unit cell in response to a control signal of a second state applied during a data sensing mode; and a sense amplifier unit for comparing a level of the sensing node with a reference level, and for sensing data stored in the selected unit cell, when the control signal applied to the precharge unit has the second state.

If the precharge unit is constructed of a positive channel metal oxide semiconductor (PMOS) transistor, the control signal of the second state has a level higher than the control signal of the first state, and a level of the control signal of the second state applied to the precharge unit may have enough voltage to turn on the PMOS transistor, that is, a voltage level approximate to a threshold voltage of the transistor. In addition, the precharge unit may be constructed of a transistor that operates by one control signal that has the first state during the precharge mode and that has the second state during the data sensing mode; or may be constructed of a precharge transistor that responds to the control signal having a first state during the precharge mode and that is connected between the sensing node and a power source, and a compensating transistor that responds to the control signal having a second state during the data sensing mode and that shares the sensing node. The control signal of the precharge unit may be a pulse type signal, and the second state may have a direct current signal having a level for the read operation. The clamp control signal may have a direct current signal having a level for the read operation or pulse type, and the sense amplifier unit may be constructed of a voltage sense amplifier or current sense amplifier.

Another exemplary embodiment of the present invention provides a data sensing node control method in a semiconductor memory device that has a memory cell array having a plurality of unit cells each of which is composed of one access transistor and one variable resistor, a sense amplifier for sensing data stored in a memory cell and a transistor connected between a sensing node of the sense amplifier and a power source, the method comprising: operating the transistor connected between the sensing node of the sense amplifier and the power source under a turn-on state without entering a turn-off state when in a precharge mode and data sensing mode; and receiving the power source supplied from the transistor at the sensing node.

The transistor operates to precharge the sensing node of the sense amplifier to a power source level during the precharge mode, and to supply a bias current to the sensing node, the bias current compensating for a reduced quantity of current at a bit line connected to the unit cell during the data sensing mode. In addition, the control signal may be a pulse type.

Another exemplary embodiment of the present invention provides a data read method in a semiconductor memory device that has a memory cell array having a plurality of unit cells each of which is composed of one access transistor and one variable resistor, the method including precharging a sensing node to a power source level in response to a control signal of a first state; selecting a unit cell from the memory cell array in response to an address signal; clamping a level of a bit line of the selected unit cell at a clamp level in response to a clamp control signal applied simultaneously upon completion of the precharging, and supplying a bias current to the sensing node in response to a control signal of a second state applied simultaneously upon completion of the precharging, to compensate for a reduced quantity of current at the bit line connected to the selected unit cell; and sensing and outputting data of the selected unit cell by comparing the sensing node level with a reference level.

If the transistor responding to the control signal of the first and second states is constructed of a PMOS transistor, the control signal of the second state has a level higher than the control signal of the first state, and the level of the second state becomes the voltage level approximate to a threshold voltage having enough voltage to turn on the transistor.

BRIEF DESCRIPTION OF THE DRAWINGS

The above and other features of the present invention will become more apparent by describing in detail exemplary embodiments thereof with reference to the attached drawings, in which.

DETAILED DESCRIPTION OF EXEMPLARY EMBODIMENTS

Figure 7:
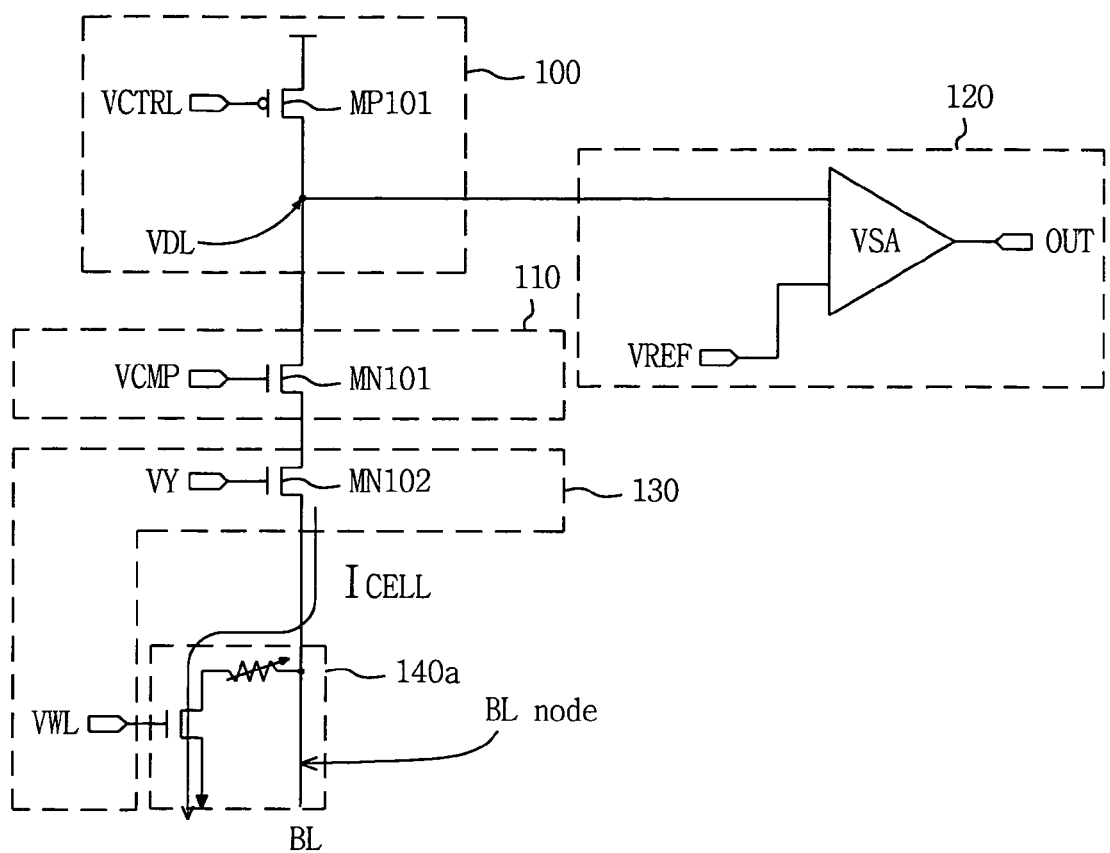
FIG. 7 is a circuit diagram of a data read circuit according to an exemplary embodiment of the present invention.
Figure 8:
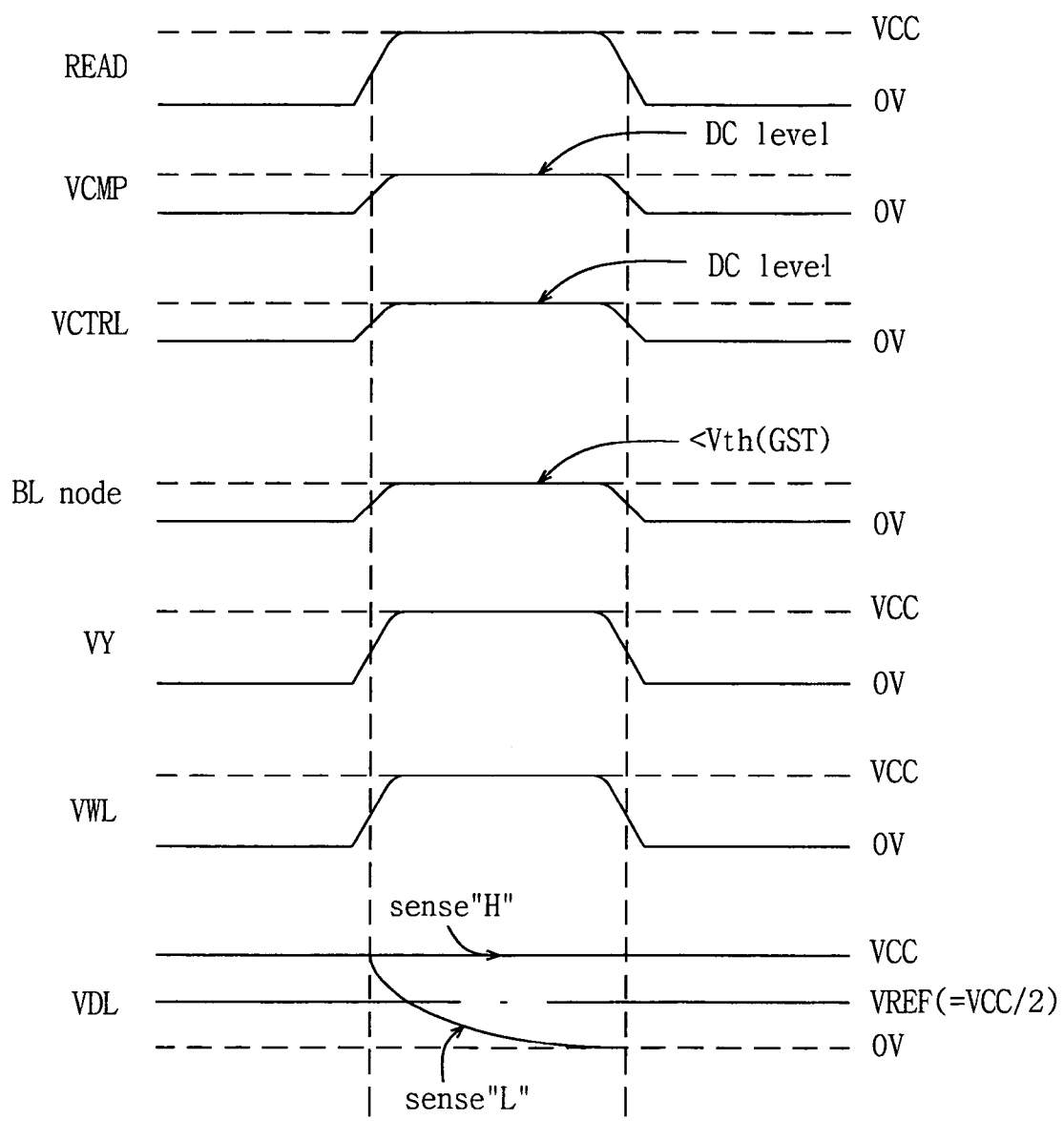
FIG. 8 is a timing diagram illustrating an operation of a node and an applied signal in the data read circuit of FIG. 7.
Figure 9:
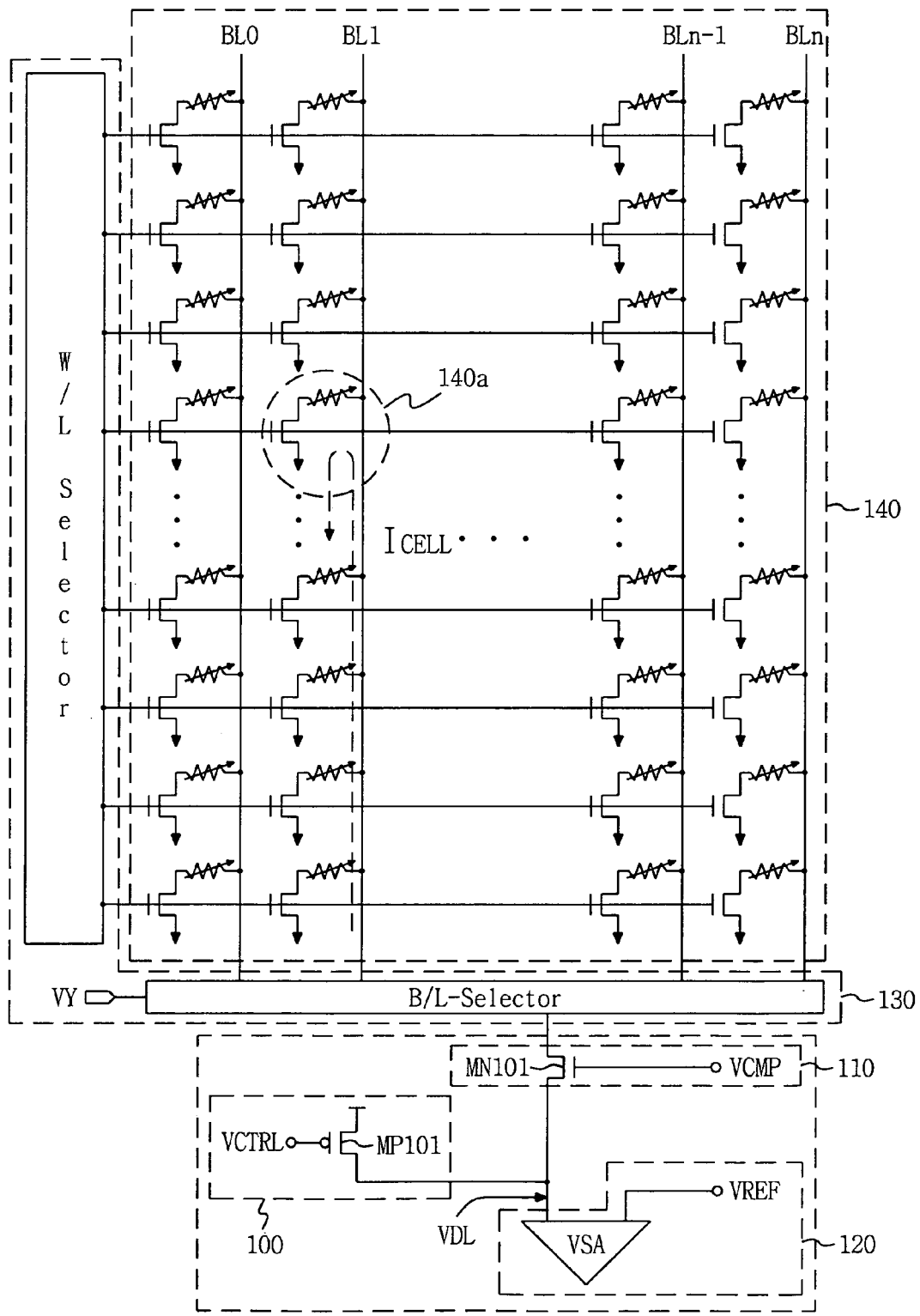
FIG. 9 is a circuit diagram of the data read circuit of FIG. 7 in a memory cell array.

Referring to FIGS. 7 through 9, according to an exemplary embodiment of the present invention, a data read circuit includes a precharge unit 100, a clamping unit 110, a selector 130, a unit cell 140a, a memory cell array 140 (shown in FIG. 9) and a sense amplifier unit 120.

The precharge unit 100 is constructed of a positive channel metal oxide semiconductor (PMOS) control transistor MP101 in which a gate receives an applied control signal VCTRL, a source is connected to a power source, and a drain is connected to a drain of a clamping negative channel metal oxide semiconductor (NMOS) transistor MN101 of the clamping unit 110 and a sensing node VDL as an input terminal of the sense amplifier unit 120. The precharge unit 100 precharges the sensing node VDL as the power source during a precharge mode, and compensates for the sensing node VDL during a data sensing mode.

The clamping unit 110 is constructed of the clamping transistor MN101 in which a gate receives a clamp control signal VCMP, a drain is connected to the sensing node VDL and the drain of the control transistor MP101 of the precharge unit 100, and a source is connected to a drain of an NMOS transistor MN102 for receiving a column address signal VY of the selector 130. The clamping unit 110 operates so that a bit line level is clamped at a level determined to be appropriate for a read operation.

The selector 130 includes the transistor MN102 in which a gate receives the column address signal VY, a drain is connected to the source of the clamping transistor MN101, and a source is connected to a bit line BL of the unit cell 140a; and a word line address signal VWL. The selector 130 is used to select a unit cell, for example, the unit cell 140a from the memory cell array 140.

The memory cell array 140 is composed of a plurality of unit cells each of which includes an access transistor and a variable resistor. The access transistor is constructed of a gate connected to a word line, a drain connected to a lower electrode of the variable resistor and a source that is grounded. The variable resistor includes a lower electrode connected to the drain of the access transistor and an upper electrode connected to the bit line BL. In addition, the variable resistor may be constructed of an upper electrode that is connected to the source of the access transistor and a lower electrode that is grounded.

The sense amplifier unit 120 is constructed of a sense amplifier VSA for receiving a level of the sensing node VDL and a reference level VREF, and for deciding whether a level state of the unit cell 140a is high or low in comparison with the reference level VREF. The sense amplifier VSA may be constructed of a current sense amplifier for sensing a current change through a bit line of the selected unit cell 140a in comparison with a reference current, or a voltage sense amplifier for sensing a voltage change in comparison with a reference voltage.

The data read circuit having the above-described configuration can prevent an error operation and is suitable for a high speed operation in a semiconductor memory device.

Referring to FIG. 8, an operation of the data read circuit referred to in FIGS. 7 and 9 will be described as follows. As shown in FIG. 8, the control signal VCTRL of a first sate in the precharge unit 100 is preserved at a low state during the precharge mode before a read command signal READ is applied, thus the control transistor MP101 of the precharge unit 100 precharges the sensing node VDL as a power source under the turn-on state. When the read command signal READ is applied, the precharge mode is shifted to a data sensing mode, and the selector 130 selects a unit cell 140a provided within the memory cell array 140 to sense data. The selector transistor MN102 responding to the column address signal VY of the selector 130 is turned on through the applied column address signal VY and word line row address signal VWL, and the access transistor of the unit cell 140a for receiving the row address signal VWL is turned on, to select the unit cell 140a.

When the read command signal READ is applied, the control signal VCTRL of the precharge unit 100 having a pulse type simultaneously increases to a level approximate to a threshold voltage of the control transistor MP101, then the control signal VCTRL becomes the control signal of a second state. In response to the control signal VCTRL of the second state, which is approximate to the threshold voltage of the control transistor MP101, the control transistor MP101 is maintained continuously under the turn on state, the precharging of the sensing node VDL is completed, and a bias current is applied to the sensing node VDL. If the selected unit cell 140a is under the RESET state, it compensates by reducing a quantity of current of the bit line BL, which is reduced by the through-current flowing within the unit cell 140a, by applying the bias current to the sensing node VDL.

Figure 1:
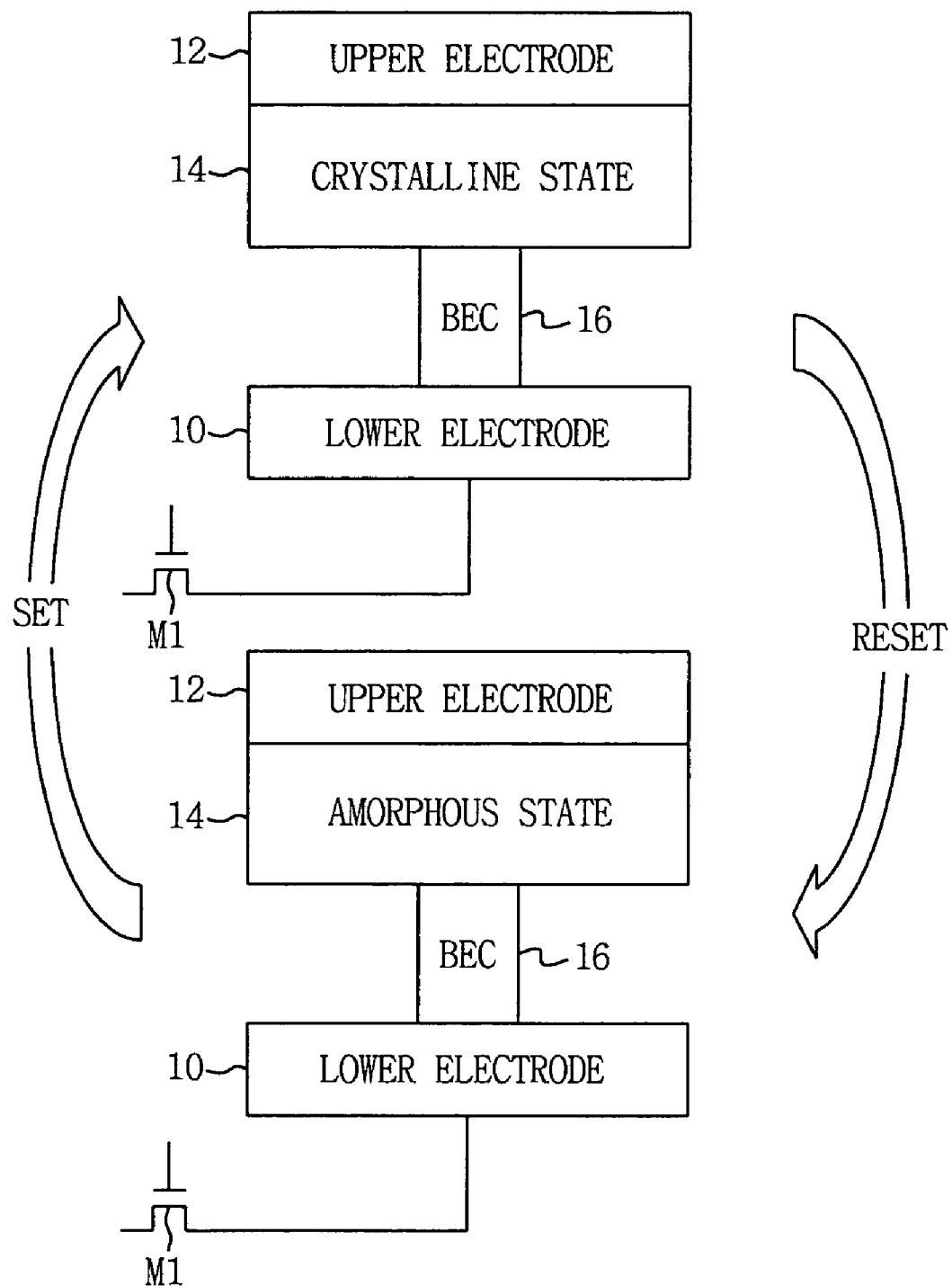
FIG. 1 is a schematic diagram illustrating a change of a phase change layer within a general variable resistor.
Figure 2:
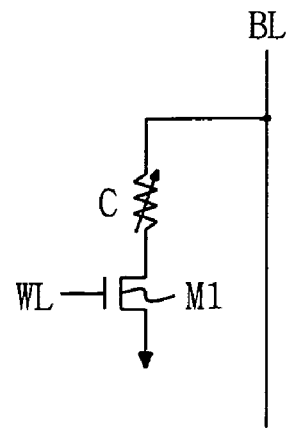
FIG. 2 is a circuit diagram of a Phase Change Random Access Memory (PRAM) unit cell.
Figure 3:
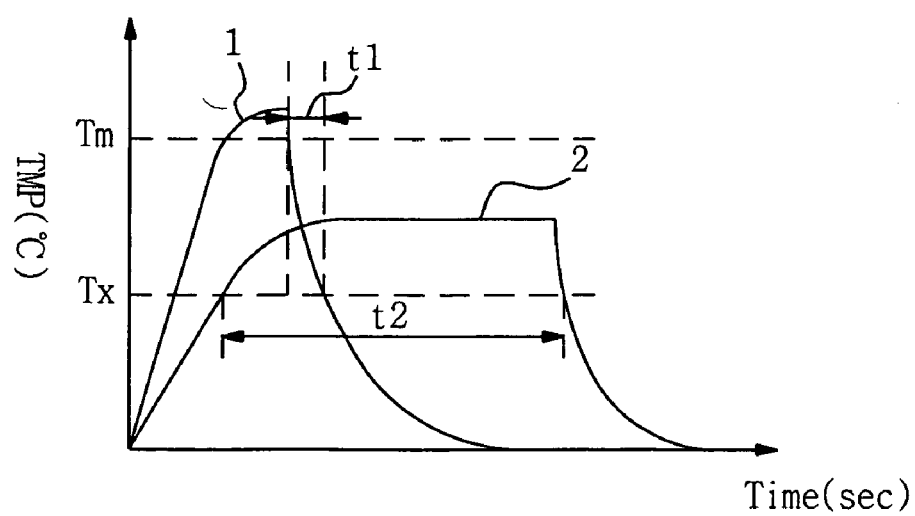
FIG. 3 is a graph illustrating a change of a general phase change layer based on time and temperature.
Figure 4:
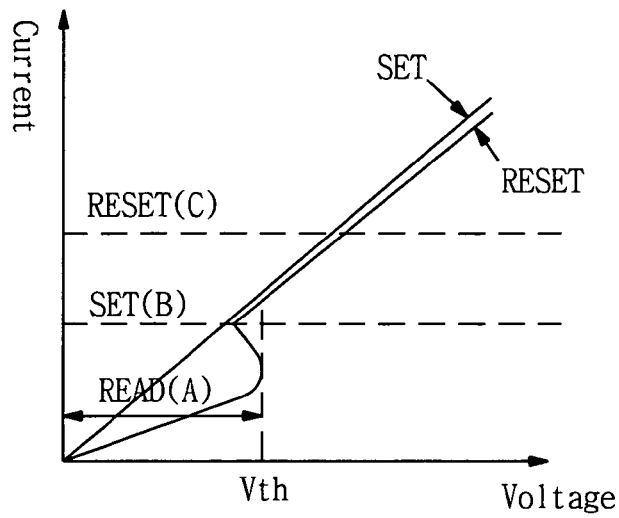
FIG. 4 is a graph illustrating a characteristic of current versus voltage of a phase change layer within a general PRAM unit cell.
Figure 5:
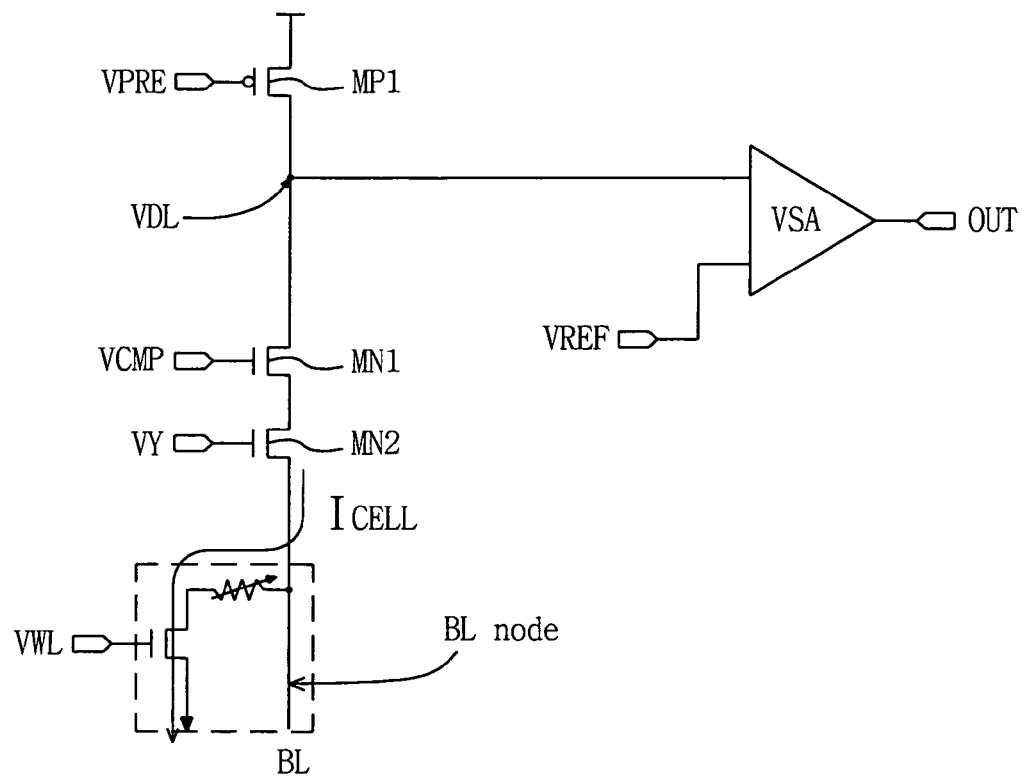
FIG. 5 is a circuit diagram of a prior art data read circuit.
Figure 6:
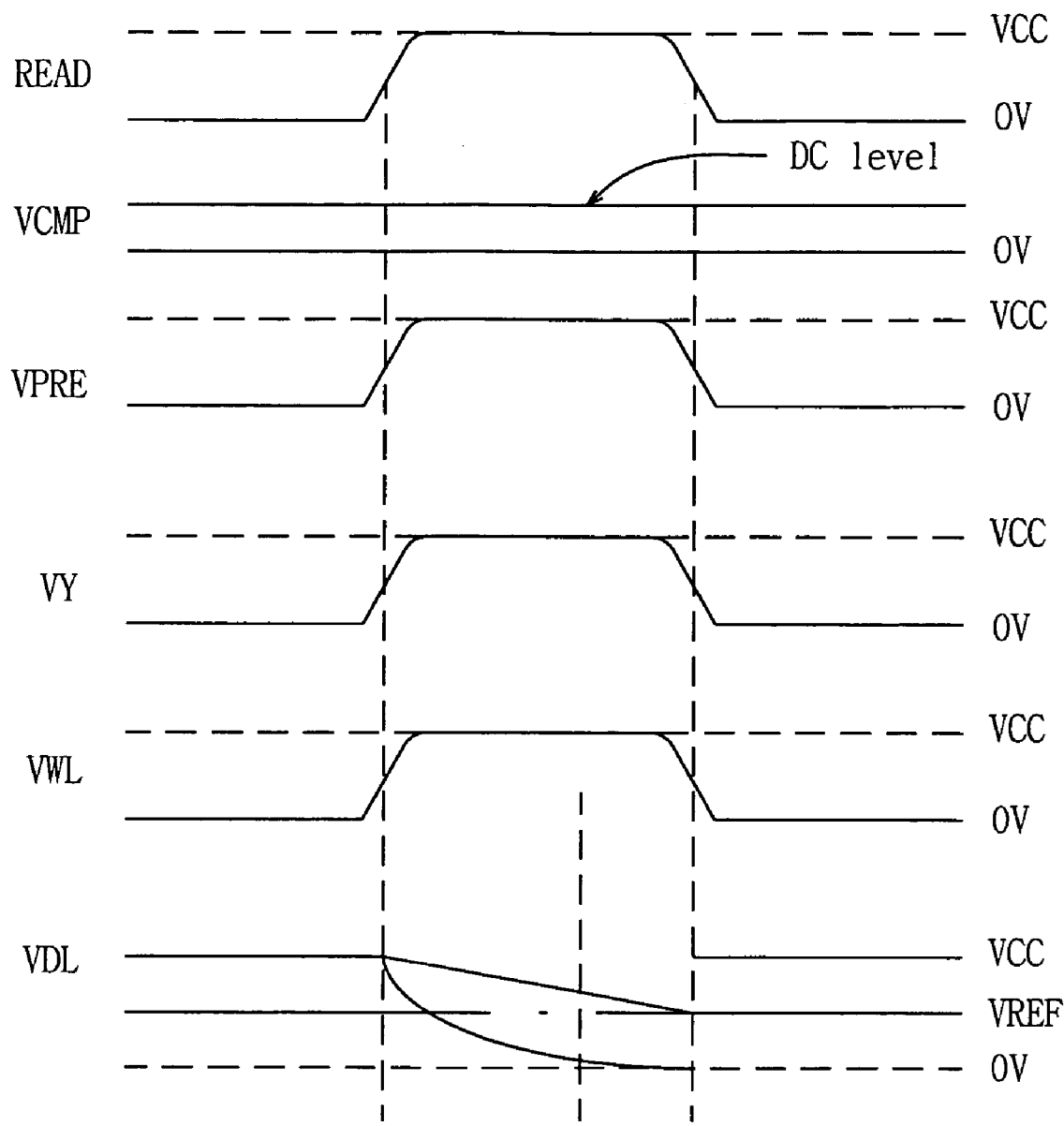
FIG. 6 is a timing diagram illustrating an operation of a node and an applied signal in the data read circuit of FIG. 5.

In addition, the clamp control signal VCMP of the pulse type is simultaneously applied to the gate of the clamping transistor MN101 of the clamping unit 110 with the read command signal READ, and the applied clamp control signal VCMP may become the control signal having a determined direct current level. Here, the bit line level (BL node) is clamped by the applied clamp control signal VCMP without deviating from a threshold voltage of the phase change layer existing within the variable resistor of the unit cell 140a. The node level (BL node) of the bit line is clamped as a determined level so that a stabile read operation can take place within the read region A (as shown, for example, in FIG. 4). The clamped node level (BL node) of the bit line BL is clamped without deviating from the threshold voltage Vth of the phase change layer provided within the variable resistor, and has a level obtained by deducting the threshold voltage of the clamping transistor MN101 from the clamp control signal VCMP.

If the threshold voltage of the phase change layer is about 1.2V, it is clamped from about 0.5 to 1.0V. The through-current ICELL of the unit cell 140a generated in the read operation has a current flow dependent upon a resistance of the phase change layer of the unit cell 140a. Hence, the through-current ICELL is generated through the access transistor of the unit cell 140a by the supplied current flow, and the input terminal VDL of the sense amplifier unit has different levels in conformity with a state of the cell. At this time, a quantity of the through-current ICELL flowing into the unit cell 140a is small due to a high resistance when the unit cell 140a is under the RESET state, and the sensing node VDL maintains a high level in comparison with the reference level VREF. When the unit cell 140a is under the SET state, a resistance of the unit cell 140a becomes low and more through-current ICELL flows as compared with the amount of through-current ICELL that flows in the RESET state, and the level of the sensing node VDL maintains a low level as compared with the reference level VREF.

The sense amplifier unit 120 decides whether the data state of the unit cell 140a is in the RESET or SET state by comparing a level of the sensing node VDL and the reference level VREF, by driving the voltage sense amplifier VSA for sensing a voltage change in comparison with a reference current. The reference level VREF is generated to be about ½ that of a typical power source that is used by a data read circuit. If the level state of the sensing node VDL is higher than the reference level VREF, it is determined to be in the RESET state, and if the level state of the sensing node VDL is lower than the reference voltage, it is determined to be in the SET state. The data read circuit compensates for the through-current ICELL flowing into the unit cell 140a by using the bias current generated in the precharge unit 100. Hence, as shown in FIG. 8, a level of the sensing node VDL is preserved uniformly.

Figure 10:
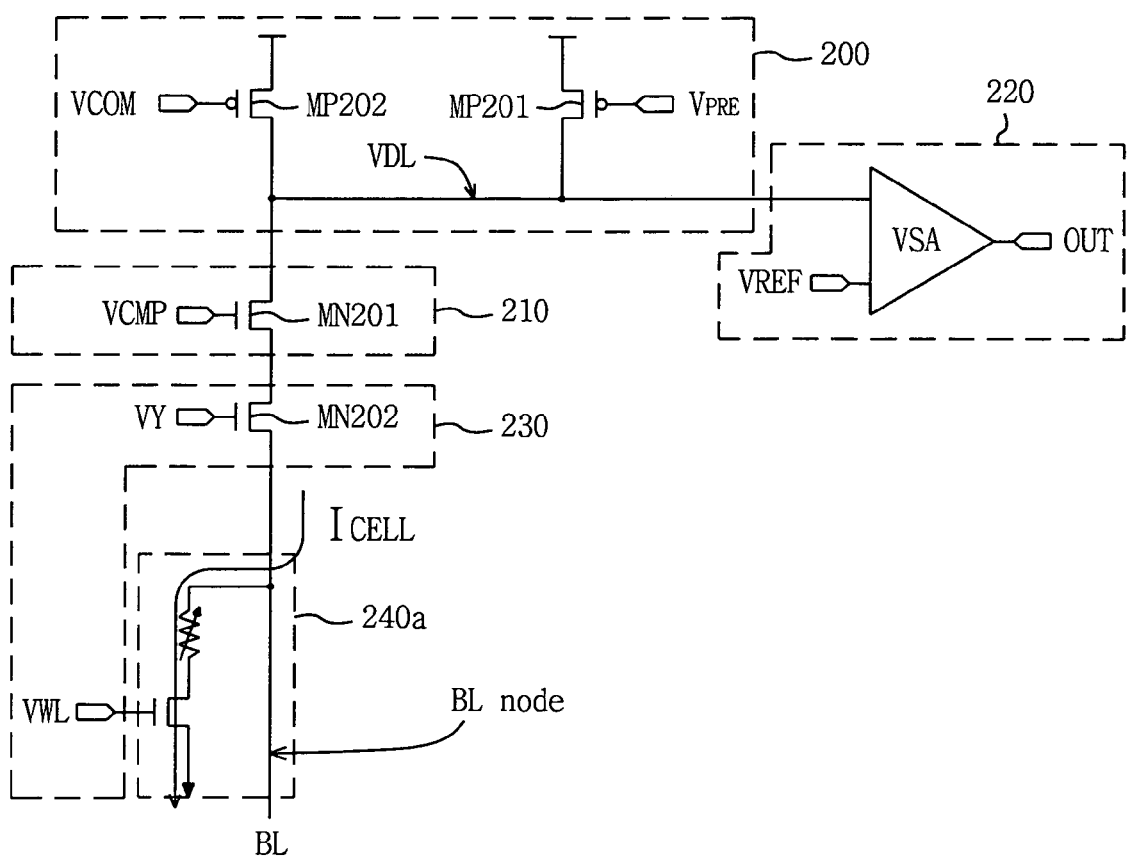
FIG. 10 is a circuit diagram of a data read circuit according to another exemplary embodiment of the present invention.
Figure 11:
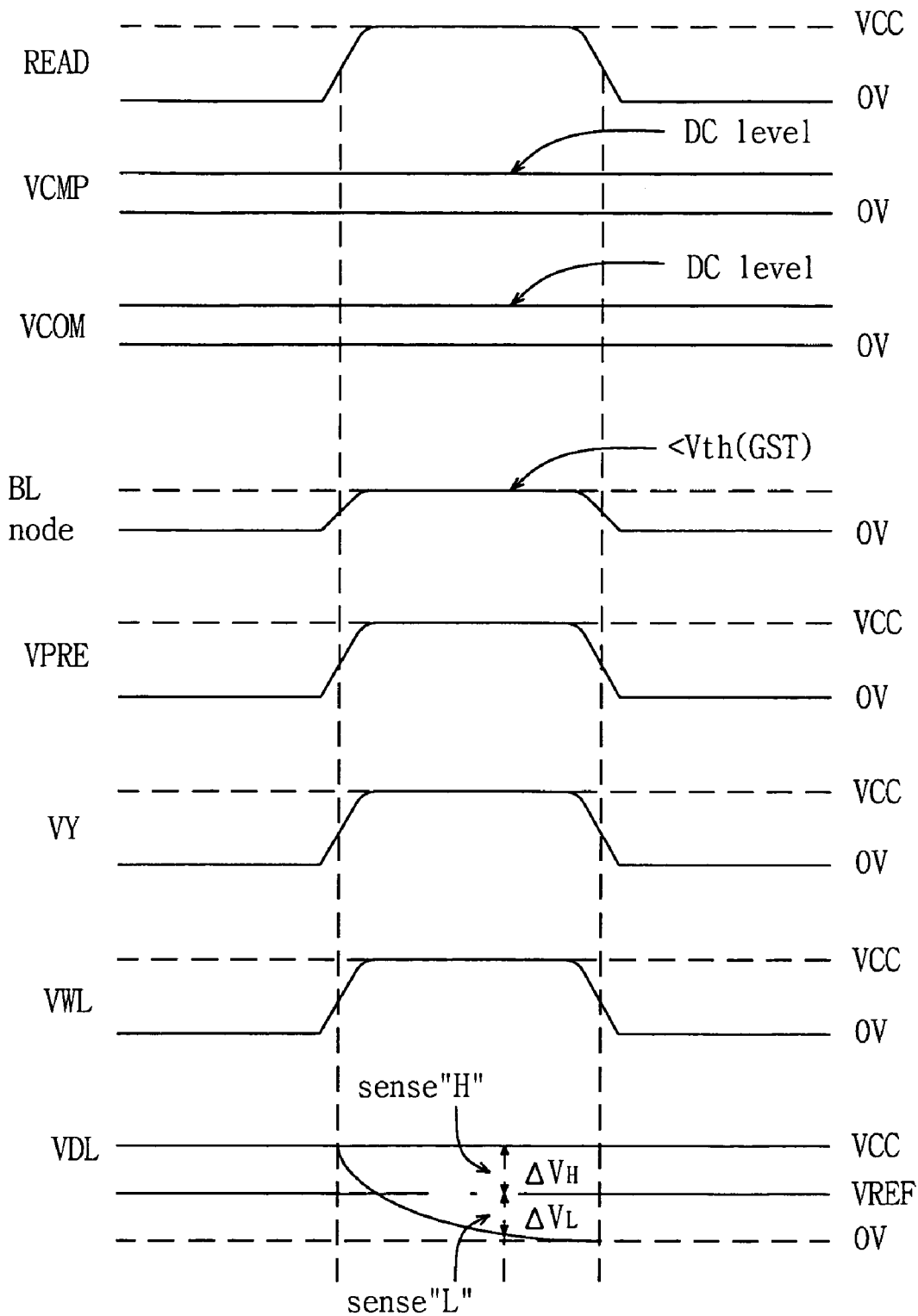
FIG. 11 is a timing diagram illustrating an operation of each node and an applied signal in the data read circuit of FIG. 10.
Figure 12:
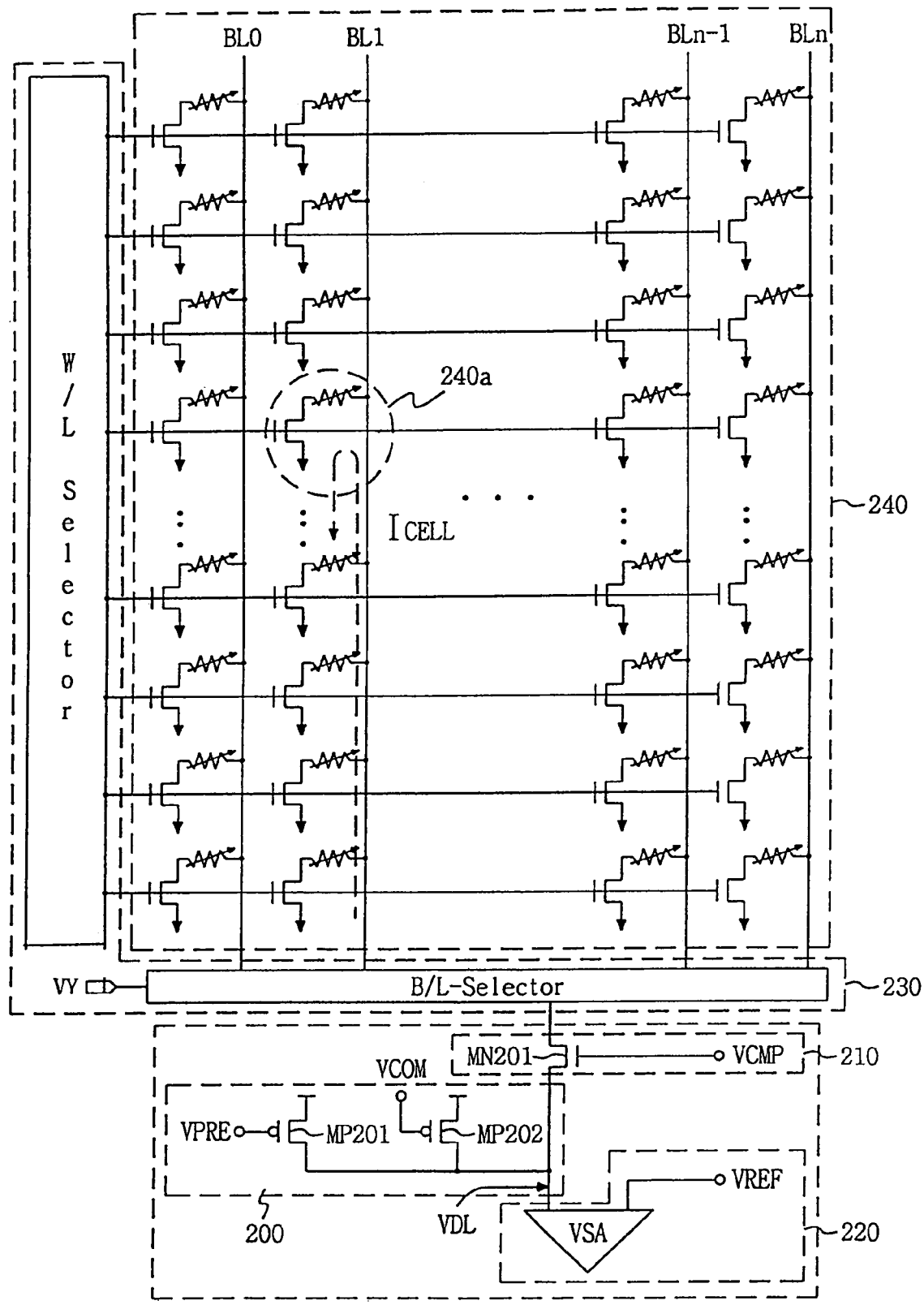
FIG. 12 is a circuit diagram of the data read circuit of FIG. 10 in a memory cell array.

Referring to FIGS. 10 through 12, according to another exemplary embodiment of the present invention, the data read circuit includes a precharge unit 200, a clamping unit 210, a selector 230, a unit cell 240a, a memory cell array 240 (shown in FIG. 12) and a sense amplifier unit 220.

The precharge unit 200 includes a PMOS precharge transistor MP201 in which a gate receives an applied precharge control signal VPRE, a source is connected to a power source, and a drain is connected to a drain of a clamping transistor MN201 of the clamping unit 210 and a sensing node VDL as an input terminal of the sense amplifier unit 220; and a PMOS compensating transistor MP202 in which a gate receives an applied compensating control signal VCOM, a source is connected to the power source, and a drain is connected to the drain of the clamping transistor MN201 of the clamping unit 210 and the sensing node VDL as the input terminal of the sense amplifier unit 220. The precharge unit 200 precharges the sensing node VDL as the power source during a precharge mode through the precharge transistor MP201 responding to the control signal VPRE of a first state, and also prevents a level falling of the sensing node VDL through the compensating transistor MP202 responding to the control signal VCOM of a second state during the data sensing mode.

The clamping unit 210 is constructed of an NMOS clamping transistor MN201 in which a gate receives a clamp control signal VCMP, a drain is connected to the sensing node VDL, the drain of the precharge transistor MP201 of the precharge unit 200 and the drain of the compensating transistor MP202, and a source is connected to a drain of a transistor MN202 for receiving a column address signal VY of the selector 230. The clamping unit 210 operates such that a bit line level is clamped at a level determined to be appropriate for a read operation.

The selector 230 selects a unit cell, for example, the unit cell 240a of the memory cell array 240, the unit cell 240a having a column address signal (VY) receipt transistor MN202 in which a gate receives the column address signal VY, a drain is connected to the source of the clamping transistor MN201, and a source is connected to a bit line BL of the unit cell 240a; and an access transistor for responding to a word line row address signal VWL.

The memory cell array 240 is composed of a plurality of unit cells each of which includes an access transistor and a variable resistor. The access transistor is constructed of a gate connected to a word line, a drain connected to a lower electrode of the variable resistor, and a source that is grounded. The variable resistor includes a lower electrode connected to the drain of the access transistor and an upper electrode connected to the bit line BL. In addition, the variable resistor may be constructed of an upper electrode that is connected to the source of the access transistor and a lower electrode that is grounded.

The sense amplifier unit 220 is constructed of a sense amplifier VSA for receiving a level of the sensing node VDL and the reference level VREF and for deciding whether a level state of the unit cell 240a is high or low in comparison with the reference level VREF. The sense amplifier VSA may be constructed of a current sense amplifier for sensing a current change through a bit line of the selected unit cell 240a in comparison with a reference current, or a voltage sense amplifier for sensing a voltage change in comparison with a reference voltage.

The data read circuit having the above-described configuration can be used to prevent an error operation and is suitable to a high speed operation in a semiconductor memory device.

Referring to FIG. 11, an operation of the data read circuit referred to in FIGS. 10 and 12 will be described as follows. As shown in FIG. 11, the control signal VPRE of the first sate in the precharge unit 200 is preserved at a low state during the precharge mode before a read command signal READ is applied, thus the precharge transistor MP201 of the precharge unit 200 precharges the sensing node VDL as a power source under the turn-on state. When the read command signal READ is applied, the precharge mode is shifted to a data sensing mode, and the selector 230 selects a unit cell 240*a* provided within the memory cell array 240 to sense data. The selector transistor MN202 responding to the column address signal VY of the selector 230 is turned on through the applied column address signal VY and row address signal VWL, and the access transistor of the unit cell 240*a* for responding to the row address signal VWL is turned on, to select the unit cell 240*a*.

When the read command signal READ is applied, the control signal VPRE of the first state of the precharge unit 200 is simultaneously shifted from low to high, and the precharge transistor MP201 is turned off to complete the precharging of the sensing node VDL. During the data sensing mode after the completion of the precharge mode, the compensating transistor MP202 is turned on by the control signal VCOM of the second state applied as a level approximate to a threshold voltage of the compensating transistor MP202, to apply a bias current to the sensing node VDL. If the selected unit cell 240*a* is under the RESET state by applying the bias current to the sensing node VDL, it compensates for the bias current by reducing a quantity of current of the bit line BL, which is reduced by the through-current ICELL flowing within the unit cell 240*a*. The precharge control signal VPRE has a pulse type, and the control signal VCOM of the second state has a determined direct current level approximate to a threshold voltage of the compensating transistor MP202, which may be applied as a pulse type.

In addition, simultaneous to the application of the read command signal READ, the clamp control signal VCMP having a determined direct current level is applied to the gate of the clamping transistor MN201 of the clamping unit 210. Here, the bit line level is clamped by the applied clamp control signal VCMP without deviating from a threshold voltage of the phase change layer existing within the variable resistor of the unit cell 240*a*. The bit line level (BL node) is clamped as a determined level so that a stabile sensing operation can take place within the read region A (shown, for example, in FIG. 4). The clamped bit line level (BL node) is clamped without deviating from the threshold voltage Vth of the phase change layer provided within the variable resistor, and has a level obtained by deducting the threshold voltage of the clamping transistor MN201 from the clamp control signal VCMP.

If the threshold voltage of the phase change layer is about 1.2V, it is clamped from about 0.5 to 1.0V. The through-current ICELL of the unit cell 240*a* generated in the read operation has a current flow dependent upon a resistance of the phase change layer of the unit cell 240*a*. The clamp control signal VCMP is applied with a determined direct current level, and may be simultaneously applied as a pulse type with the read command signal READ. The through-current ICELL is generated through the access transistor of the unit cell 240*a* by the current flow supplied that is dependent upon the resistance of the phase change layer, and the sensing node VDL as the input terminal of the sense amplifier unit 220 has different levels in conformity with a state of the unit cell 240*a*. At this time, a quantity of the through-current ICELL flowing into the unit cell 240*a* is small due to a high resistance when the unit cell 240*a* is under the RESET state, and the sensing node VDL maintains a high level in comparison with the reference level VREF. When the unit cell 240*a* is under the SET state, the resistance of the unit cell 240*a* becomes low and more through-current ICELL flows as compared with the amount of through-current ICELL that flows in the RESET state, and the level of the sensing node VDL maintains a low level as compared with the reference level VREF.

The sense amplifier unit 220 decides whether the data state of the unit cell 240*a* is in the RESET or SET state by comparing a level of the sensing node VDL and the reference level VREF, by driving the voltage sense amplifier VSA for sensing a voltage change in comparison with a reference current. The reference level VREF is generated to be about ½ that of a typical power source that is used by a data read circuit. If the level state of the sensing node VDL is higher than the reference level VREF, it is determined to be in the RESET state, and if the level state of the sensing node VDL is lower than the reference voltage, it is determined to be in the SET state. The data read circuit compensates for the through-current ICELL flowing into the unit cell 240*a* by using the bias current generated in the precharge unit 200. Hence, a level of the sensing node VDL is preserved uniformly.

It is to be understood by one of ordinary skill in art that the present invention may be applied to a Magnetic Random Access Memory (MRAM) and other types of memories such as Flash Random Access Memory (FRAM), etc.

As described above, an error operation can be prevented or substantially reduced by applying a bias current to compensate for a through-current flowing within a unit cell of a memory cell array when sensing data, and thus, a data sensing speed and a high speed operation in a semiconductor memory device can be enhanced.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A data read circuit for use with a phase change random access memory (PRAM), wherein the data read circuit detects data by sensing a level of a sensing node that changes in response to a current flowing through a unit cell of the PRAM when the sensing node is connected to the unit cell and is charged to a first voltage level, the data read circuit comprising:
    a precharge transistor for precharging the sensing node to the first voltage level in response to a first state of a first control signal; and
    a compensating transistor for supplying an amount of the current it flowing through the unit cell to the sensing node in response to a second state of a second control signal to prevent the first voltage level of the sensing node from falling when data is read from the unit cell.

2. The circuit of claim 1, wherein the first state of the first control signal is applied during a precharge mode.

3. The circuit of claim 1, wherein the second state of the second control signal is applied during a data sensing mode.

4. The circuit of claim 1, wherein the unit cell comprises one access transistor and one variable resistor, the variable resistor is connected between the access transistor and a bit line connected to the sensing node, and the access transistor is connected between the variable resistor and ground.

5. The circuit of claim 1, wherein the unit cell comprises one access transistor and one variable resistor, the access transistor is connected between the variable resistor and a bit line connected to the sensing node, and the variable resistor is connected between the access transistor and ground.

6. A data read circuit for use with a phase change random access memory (PRAM), wherein the data read circuit detects data by sensing a level of a sensing node, the data read circuit comprising:
   a precharge transistor for precharging the sensing node to a first voltage level in response to a first state of a first control signal; and
   a compensating transistor for supplying an amount of current flowing through a unit cell of the PRAM to the sensing node in response to a second state of a second control signal to prevent the first voltage level of the sensing node from falling when data is read from the unit cell.

7. The data read circuit of claim 6, wherein the first state of the first control signal is applied during a precharge mode.

8. The data read circuit of claim 6, wherein the second state of the second control signal is applied during a data sensing mode.

9. The data read circuit of claim 6, wherein the unit cell comprises one access transistor and one variable resistor, the variable resistor is connected between the access transistor and a bit line connected to the sensing node, arid the access transistor is connected between the variable resistor and ground.

10. The data read circuit of claim 6, wherein the unit cell comprises one access transistor and one variable resistor, the access transistor is connected between the variable resistor and a bit line connected to the sensing node, and the variable resistor is connected between the access transistor and ground.

11. A method of reading data from a semiconductor memory device including a phase change random access memory (PRAM) cell array having a plurality of unit cells, the method comprising:
   precharging a sensing node to a voltage level in response to a first state of a precharge control signal;
   selecting a unit cell of the PRAM cell array in response to an address signal;
   clamping a voltage level of a bit line of the selected unit cell at a clamp level for reading data from the selected unit cell in response to a clamp control signal;
   supplying an amount of current flowing through the selected unit cell to the sensing node in response to a second state of a compensating control signal to prevent the voltage level of the sensing node from falling when the data is read from the selected unit cell; and
   sensing and outputting data of the selected unit cell by comparing the voltage level of the sensing node with a reference voltage level.

* * * * *